US006559520B2

(12) United States Patent
Matsuki et al.

(10) Patent No.: US 6,559,520 B2
(45) Date of Patent: May 6, 2003

(54) SILOXAN POLYMER FILM ON SEMICONDUCTOR SUBSTRATE

(75) Inventors: Nobuo Matsuki, Tama (JP); Lee Jea Sik, Tama (JP); Yoshinori Morisada, Tama (JP); Satoshi Takahashi, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 10/133,419

(22) Filed: Apr. 25, 2002

(65) Prior Publication Data

US 2002/0160626 A1 Oct. 31, 2002

Related U.S. Application Data

(60) Division of application No. 09/827,616, filed on Apr. 6, 2001, which is a continuation-in-part of application No. 09/243,156, filed on Feb. 2, 1999, now abandoned.

(30) Foreign Application Priority Data

Feb. 5, 1998  (JP) .............................. 10-37929

(51) Int. Cl.[7] .............................................. H01L 23/58
(52) U.S. Cl. ........................ 257/642; 257/40; 257/58; 438/789; 438/790
(58) Field of Search ................... 438/780, 787, 438/789, 790; 257/40, 58, 642, 791, 792

(56) References Cited

U.S. PATENT DOCUMENTS

| 5,314,724 A | | 5/1994 | Tsukune et al. |
|---|---|---|---|
| 5,380,555 A | | 1/1995 | Mine et al. |
| 5,433,786 A | | 7/1995 | Hu et al. |
| 5,494,712 A | | 2/1996 | Hu et al. |
| 5,554,570 A | | 9/1996 | Maeda et al. |
| 5,962,581 A | * | 10/1999 | Hayase et al. ............... 524/588 |
| 5,989,998 A | | 11/1999 | Sugahara et al. |
| 6,051,321 A | | 4/2000 | Lee et al. |
| 6,054,379 A | | 4/2000 | Yau et al. |
| 6,088,884 A | | 5/2000 | Rose et al. |

FOREIGN PATENT DOCUMENTS

| EP | 0 826 791 A2 | 3/1998 |
|---|---|---|
| JP | 10-284486 | 10/1998 |
| JP | 11-288931 | 10/1999 |

OTHER PUBLICATIONS

U.S. patent application Ser. No. 09/243,156, Matsuki et al., filed Feb. 2, 1999.
U.S. patent application Ser. No. 09/326,847, Matsuki et al., filed Jun. 7, 1999.
U.S. patent application Ser. No. 09/326,848, Matsuki et al., filed Jun. 7, 1999.
U.S. patent application Ser. No. 09/691,079, Matsuki, filed Oct. 18, 2000.
U.S. patent application Ser. No. 09/691,376, Matsuki, filed Oct. 18, 2000.
U.S. patent application Ser. No. 09/820,075, Matsuki et al., Mar. 28, 2001.

* cited by examiner

*Primary Examiner*—Kamand Cuneo
*Assistant Examiner*—Lisa Kilday
(74) *Attorney, Agent, or Firm*—Knobbe, Martens Olson & Bear, LLP

(57) ABSTRACT

A siloxan polymer insulation film has a dielectric constant of 3.1 or lower and has —$SiR_2O$— repeating structural units with a C atom concentration of 20% or less. The siloxan polymer also has high thermal stability and high humidity-resistance. The siloxan polymer is formed by directly vaporizing a silicon-containing hydrocarbon compound of the formula $Si_\alpha O_{\alpha-1} R_{2\alpha-\beta+2}(OC_nH_{2n+1})_\beta$ wherein $\alpha$ is an integer of 1–3, $\beta$ is 2, $n$ is an integer of 1–3, and R is $C_{1-6}$ hydrocarbon attached to Si, and then introducing the vaporized compound with an oxidizing agent to the reaction chamber of the plasma CVD apparatus. The residence time of the source gas is lengthened by reducing the total flow of the reaction gas, in such a way as to form a siloxan polymer film having a micropore porous structure with low dielectric constant.

3 Claims, 2 Drawing Sheets

SILOXAN POLYMER FILM ON SEMICONDUCTOR SUBSTRATE

This is a divisional of U.S. patent application Ser. No. 09/827,616 filed Apr. 6, 2001, which is a continuation-in-part of U.S. patent application Ser. No. 09/243,156 filed Feb. 2, 1999, now abandoned, which claims priority based on Japanese patent application No. 37929/1998 filed Feb. 5, 1998; U.S. application Ser. No. 09/326,847 filed Jun. 7, 1999; U.S. patent application Ser. No. 09/326,848 filed Jun. 7, 1999; and U.S. patent application Ser. No. 09/691,376 filed Oct. 18, 2000, the entire disclosure of all of which is incorporated herein by reference.

BACKGROUND OF THE INVENTION

1. Field of the Invention

This invention relates generally to a semiconductor technique and more particularly to a siloxan polymer insulation film on a semiconductor substrate and a method for forming the film by using a plasma CVD (chemical vapor deposition) apparatus.

2. Description of Related Art

Because of the recent rise in requirements for the large-scale integration of semiconductor devices, a multi-layered wiring technique attracts a great deal of attention. In these multi-layered structures, however, capacitance among individual wires hinders high-speed operations. In order to reduce the capacitance it is necessary to reduce the dielectric constant (relative permittivity) of the insulation film. Thus, various materials having a relatively low dielectric constant have been developed for insulation films.

Conventional silicon oxide films $SiO_x$ are produced by a method in which oxygen $O_2$ or nitrogen oxide $N_2O$ is added as an oxidizing agent to a silicon material gas such as $SiH_4$ or $Si(OC_2H_5)_4$ and then processed by heat or plasma energy. Its dielectric constant is about 4.0.

Alternatively, a fluorinated amorphous carbon film has been produced from $C_xF_yH_z$ as a material gas by a plasma CVD method. Its dielectric constant $\epsilon$ is as low as 2.0–2.4.

Another method to reduce the dielectric constant of insulation film has been made by using the good stability of Si—O bond. A silicon-containing organic film is produced from a material gas under low pressure (1 Torr) by the plasma CVD method. The material gas is made from P-TMOS (phenyl trimethoxysilane, formula 1), which is a compound of benzene and silicon, vaporized by a babbling method. The dielectric constant $\epsilon$ of this film is as low as 3.1.

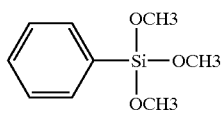
(1)

A further method uses a porous structure made in the film. An insulation film is produced from an inorganic SOG material by a spin-coat method. The dielectric constant $\epsilon$ of the film is as low as 2.3.

However, the above noted approaches have various disadvantages as described below.

First, the fluorinated amorphous carbon film has lower thermal stability (370° C.), poor adhesion with silicon-containing materials and also lower mechanical strength. The lower thermal stability leads to damage under high temperatures such as over 400° C. Poor adhesion may cause the film to peel off easily. Further, the lower mechanical strength can jeopardize wiring materials.

Oligomers that are polymerized using P-TMOS molecules do not form a linear structure in the vapor phase, such as a siloxane structure, because the P-TMOS molecule has three O—$CH_3$ bonds. The oligomers having no linear structure cannot form a porous structure on a Si substrate, i.e., the density of the deposited film cannot be reduced. As a result, the dielectric constant of the film cannot be reduced to a desired degree.

In this regard, the babbling method means a method wherein vapor of a liquid material, which is obtained by having a carrier gas such as argon gas pass through the material, is introduced into a reaction chamber with the carrier gas. This method generally requires a large amount of a carrier gas in order to cause the material gas to flow. As a result, the material gas cannot stay in the reaction chamber for a sufficient length of time to cause polymerization in a vapor phase.

Further, the SOG insulation film of the spin-coat method has a problem in that the material cannot be applied onto the silicon substrate evenly and another problem in which a cure system after the coating process is costly.

SUMMARY OF THE INVENTION

According to one aspect of the present invention, a high quality siloxan polymer can be formed by vaporizing a silicon-containing hydrocarbon compound of the formula $Si_\alpha O_{\alpha-1} R_{2\alpha-\beta+2}(OC_nH_{2n+1})_\beta$ wherein $\alpha$ is an integer of 1–3, $\beta$ is 2, n is an integer of 1–3, and R is $C_{1-6}$ hydrocarbon attached to Si, and then introducing the vaporized compound with an oxidizing agent to the reaction chamber of a plasma CVD apparatus. The residence time of the source gas is lengthened by reducing the total flow of the reaction gas, in such a way as to form a siloxan polymer film having a micropore porous structure with low dielectric constant.

In the above, if the additive gas does not include an oxidizing agent but includes gases such as He, H2, CH4, etc., a quality low dielectric constant film with a low dielectric constant of k=2.6~3.1 can still be obtained. If an oxidizing agent is added to the additive gas especially when the compound of the material gas has two alkoxyl groups, it is possible to form a low dielectric constant ("low-k") film with a dielectric constant of k<3.1 at low cost by improving productivity by accelerating the film-forming speed. Additionally, in the above, by controlling the flow of an oxidizing agent, an oxygen concentration in the film increases without forming an oxide film structure, and surprisingly, the dielectric constant becomes low, and further, the deposition speed significantly increases. The above effects can significantly be exhibited when (i) the flow rate of the reaction gas is prolonged, (ii) the material gas has two alkoxyl groups, and (ii) an oxidizing gas is added to an additive gas. The resulting siloxan polymer film can have a dielectric constant of 3.1 or lower and have —$SiR_2O$— repeating structural units with a C atom concentration of 20% or less (i.e., the compound is fragmented predominantly or selectively at the bond between the hydrocarbon and the oxygen). When the C atom concentration is low, selectivity with etching resist (photosensitive resin) is improved. Additionally, the siloxan polymer has high thermal stability and high humidity-resistance on a semiconductor substrate. Furthermore, because this technique can lower a dielectric constant of a film to approximately 2.4, the scope of applicable devices expands. In addition, according to the present invention, device-manufacturing costs can be reduced and the yield rate can be improved significantly.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

DETAILED DESCRIPTION OF THE PREFERRED EMBODIMENTS OF THE INVENTION

Figure 1:
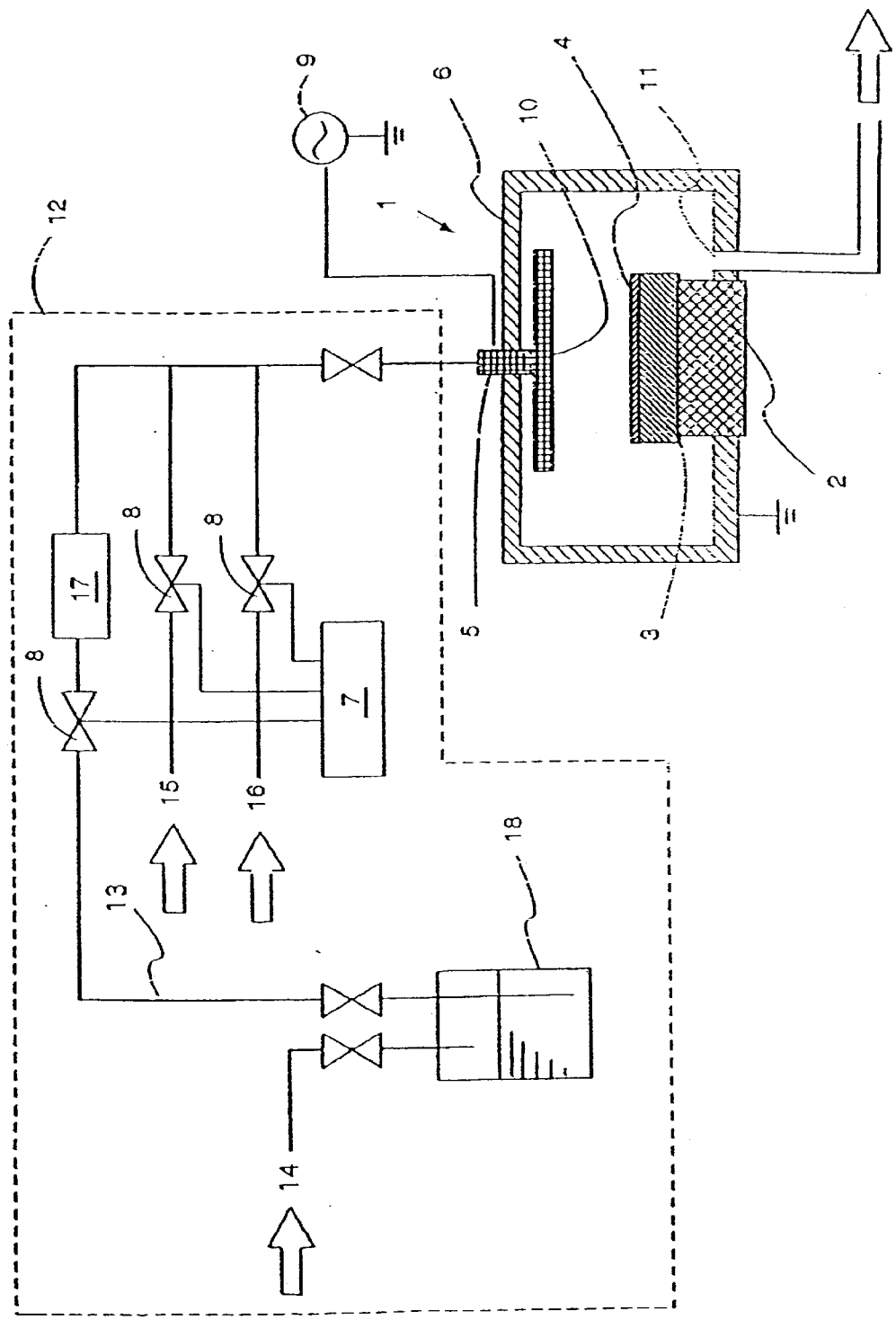
FIG. 1 is a schematic diagram illustrating a plasma CVD apparatus used for forming an insulation film.

A first embodiment of the present invention is a method for forming a siloxan polymer insulation film on a semiconductor substrate by plasma treatment, comprising the steps of: (i) vaporizing a silicon-containing hydrocarbon compound to produce a material gas for siloxan polymer, said silicon-containing hydrocarbon having the formula $Si_{\alpha}O_{\alpha-1}R_{2\alpha-\beta+2}(OC_nH_{2n+1})_\beta$ wherein α is an integer of 1–3, β is 2, n is an integer of 1–3, and R is $C_{1-6}$ hydrocarbon attached to Si; (ii) introducing the material gas into a reaction chamber for plasma CVD processing wherein a semiconductor substrate is placed; (iii) introducing an additive gas comprising an inert gas and an oxidizing gas, said oxidizing gas being used in an amount less than the material gas; and (iv) forming a siloxan polymer film having —$SiR_2O$— repeating structural units on the semiconductor substrate by activating plasma polymerization reaction in the reaction chamber.

In the above, when the additive gas comprises an oxidizing gas in an effective amount (e.g., 20–80% of the material gas, preferably 40–60% of the material gas in sccm measurement), the C atom concentration of the siloxan polymer film can be rendered no more than 20%. Low C atom concentration is very effective in etching treatment as explained below.

Low C Concentration and Etching Process

A manufacturing process of the wiring structure of a device comprises: An insulation film such as a low-k film is formed on a wafer, a photosensitive resin (an etching resist) is formed on the insulation film, a resist pattern is formed on the wafer by removing the resist on necessary portions using a photographic sensitization technique lithograph. After this, by irradiating ions of ionized CF4, Ar gases, etc. on the wafer vertically from above, the insulation film formed on portions which are not covered by the resist is removed and a wiring shape to bury (etching) Cu is formed. At this etching process, the resist is also scraped simultaneously. For this reason, if the etching resistance of a resist is weak, a thicker resist is required to protect the insulation film to be preserved. Additionally, due to the reduction of the device node, the width of a resist, which is to be preserved as a pattern becomes short, and the ratio of the height of a resist to the width of a pattern increases. This makes wiring processing difficult, and improving of a rate of etching a low-k film to a rate of etching a resist and of etching selectivity is required.

| Film Type | Structure in the film | Etching Gas | Dissociation Gas | Reaction |
|---|---|---|---|---|
| Resist | C | CF4 | CF4 | I |
| CHx | | O2 | CO or CO2 | II |
| Low-k SiOCH | Si-O | CF4 | SiF4, CO2, CO | III |
| | C | CF4 | CF4 | IV |
| | | O (contained in the film) | CO, CO2 | V |
| | | O2 | CO, CO2 | VI |
| Oxidation SiO film | Si-O | CF4 | SiF4, CO2, CO | VII |

CF4-based etching of a low-k film is done by dissolving Si and C which comprise a structure into dissociation gases shown in I to VI above. In a low-k film which mainly contains Si, Si dissociates by changing into a gas such as SiF4, etc. due to F present in etching gases, and C contained in the film dissociates by changing into a gas such as CO, etc. as a result of bonding with O which exists in the film. Simultaneously, the resist is etched to some extent while the structures composed of C change into a gas such as CF4, etc. due to F. In the case of conventionally used oxide film etching, reaction VII proceeds faster as compared with reaction I and high etching selectivity can be achieved. In the case of low-k film etching, reaction III proceeds sufficiently quickly as compared with reaction I. Because reaction V, however, proceeds as slowly as reaction I, high etching selectivity achieved in the case of oxide film etching cannot be achieved. Low-k film etching, however, is promoted because reaction V takes place with oxygen contained in the film. When the C atom concentration of a film is 20% or lower, selective etching can effectively be accomplished.

Further, when the C atom concentration of a film is low, not only etching selectivity but also etching performance can be improved as explained below. From the strict technological point of view, it is necessary to consider a plasma state for etching reactions. However, the above reaction models are highly complex, and thus herein a stoichiometric model of simple reactions is considered. A film structure is analyzed using XPS which is widely used as a method for accurate analysis. By this method, H cannot be analyzed, and further H dissociates into a gas by itself. Thus, reactions on elements besides H will be discussed below.

If oxygen is not added, an etching reaction formula of an SiOCH system low-k film which is not covered by the resist is:

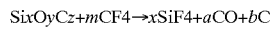

$$SixOyCz + mCF4 \rightarrow xSiF4 + aCO + bC$$

When a ratio of O contained in the film is small, a phenomenon takes place wherein C accumulates without sufficiently gasifying to stop etching. For this reason, an experiment to speed up an etching rate by gasifying carbon contained in the film into CO or CO2 by adding a small amount of oxygen to an etching gas is conducted. In this case, a reaction formula is:

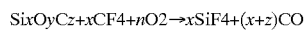

$$SixOyCz + xCF4 + nO2 \rightarrow xSiF4 + (x+z)CO$$

For the above-mentioned formula to proceed, stoichiometrically it is necessary to add oxygen O2 of n=(x+z−y)/2.

Alternatively, in the case of a model in which C gasifies into CO2, a reaction formula is:

SixOyCz+xCF4+nO2→xSiF4+(x+z)CO2

For the above-mentioned formula to proceed, it is necessary to add oxygen O2 of n=x+z−y/2.

A SiOCH low-k film of k<3.1 formed as a low dielectric constant film without adding an oxidizing agent to an additive gas, however, contains C by more than 20%. A composition of a low-k film formed using the preceding technique J-039 (a film-forming example in a comparison experiment) is Si:C:O=33:22:45 (%/o). In this case, x=0.33, y=0.45 and z=0.22. In a model in which C dissociates into CO, n=0.1 and in a model in which C dissociates into CO2, n=0.325. In other words, it can be understood that it is necessary to add oxygen O2 of approximately 0.1 mol to 0.33mol to an F gas of CF4:0.33mol.

Residence Time and Gas Flow

The residence time of the reaction gas is determined based on the capacity of the reaction chamber for reaction, the pressure adapted for reaction, and the total flow of the reaction gas. The reaction pressure is normally in the range of 1–10 Torr, preferably 3–7 Torr, so as to maintain stable plasma This reaction pressure is relatively high in order to lengthen the residence time of the reaction gas. The total flow of the reaction gas is important to reducing the dielectric constant of a resulting film. It is not necessary to control the ratio of the material gas to the additive gas. In general, the longer the residence time, the lower the dielectric constant becomes. The material gas flow necessary for forming a film depends on the desired deposition rate and the area of a substrate on which a film is formed. For example, in order to form a film on a substrate [r(radius)=100 mm] at a deposition rate of 300 nm/min, at least 50 sccm of the material gas is expected to be included in the reaction gas. That is approximately $1.6 \times 10^2$ sccm per the surface area of the substrate (m²). The total flow can be defined by residence time (Rt). When Rt is defined described below, a preferred range of Rt is 100 msec≲Rt, more preferably 165 msec≲Rt, further more preferably 200 msec≲Rt≲5 sec. In a conventional plasma TEOS, Rt is generally in the range of 10–30 msec.

$Rt[s]=9.42\times10^7(Pr\cdot Ts/Ps\cdot Tr)r_w^2 d/F$ wherein:
Pr: reaction chamber pressure Pa)
Ps: standard atmospheric pressure (Pa)
Tr: average temperature of the reaction gas (K)
Ts: standard temperature (K)
$r_w$: radius of the silicon substrate (m)
d: space between the silicon substrate and the upper electrode (m)
F: total flow volume of the reaction gas (sccm)

In the above, the residence time means the average period of time in which gas molecules stay in the reaction chamber. The residence time (Rt) can be calculated at Rt=αV/S, wherein V is the capacity of the chamber (cc), S is the volume of the reaction gas (cc/s), and α is a coefficient determined by the shape of the reaction chamber and the positional relationship between the inlet of gas and the outlet of exhaust. The space for reaction in the reaction chamber is defined by the surface of the substrate (πr²) and the space between the upper electrode and the lower electrode. Considering the gas flow through the space for reaction, α can be estimated as ½. In the above formula, α is ½.

Material Gas and Additive Gas

In the present invention, the silicon-containing hydrocarbon compound expressed as the general formula $Si_\alpha O_\beta C_x H_y$ (α, β, x, and y are integers) is preferably a compound having the formula $Si_\alpha O_{\alpha-1} R_{2\alpha-\beta+2}(OC_nH_{2n+1})$, wherein α is an integer of 1–3, β is 2, n is an integer of 1–3, and R is $C_{1-6}$ hydrocarbon attached to Si. That is, the preferred compound has at least one Si—O bond, two O—$C_nH_{2n+1}$ bonds, and two hydrocarbon radicals bonded with silicon (Si). In the above, in an embodiment, the alkoxy present in the silicon-containing hydrocarbon has 1 to 3 carbon atoms. In another embodiment, the hydrocarbon present in the silicon-containing hydrocarbon compound has 1 to 6 carbon atoms (n=1–6). In another embodiment, the silicon-containing hydrocarbon compound has 1 to 3 silicon atoms. In still another embodiment, the silicon-containing hydrocarbon compound has 1 to 2 silicon atoms (α=1 or 2). More specifically, the silicon-containing hydrocarbon compound includes at least one species of the compound expressed by the chemical formula (2) as follows:

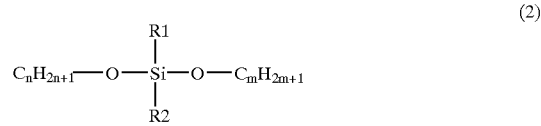

(2)

wherein R1 and R2 are one of $CH_3$, $C_2H_3$, $C_2H_5$, $C_3H_7$ and $C_6H_5$, and m and n are any integer.

Except for those species indicated above, the silicon-containing hydrocarbon compound can include at least one species of the compound expressed by the chemical formula (3) as follows:

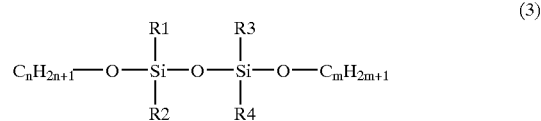

(3)

wherein R1, R2, R3 and R4 are one of $CH_3$, $C_2H_3$, $C_2H_5$, $C_3H_7$ and $C_6H_5$, and m and n are any integer.

Further, it should be noted that the silicon-containing hydrocarbon compound can be any combinations of these compounds and mixtures.

In accordance with another aspect of this invention, an insulation film is formed on a substrate and the film is polymerized with plasma energy in a plasma CVD apparatus by using a material gas including a silicon-containing hydrocarbon compound expressed by formula 2.

Additionally, the insulation film is formed on a substrate and the film is polymerized with plasma energy in a plasma CVD apparatus by using a material gas including a silicon-containing hydrocarbon compound expressed by formula 3.

In accordance with a further aspect of this invention, a material for forming an insulation film is supplied in a vapor phase in the vicinity of a substrate and is treated in a plasma CVD apparatus to form the insulation film on the substrate by chemical reaction, and the material is further expressed by formula 2.

Additionally, a material for forming an insulation film is supplied in a vapor phase in the vicinity of a substrate and is treated in a plasma CVD apparatus to form the insulation film on the substrate by chemical reaction, and the material is further expressed by formula 3.

The additive gases usable in the present invention are argon gas and helium gas, for example. In an embodiment, argon is principally used for stabilizing plasma, while helium is used for improving uniformity of the plasma and also uniformity of thickness of the insulation film.

In the method described above, the first step of direct vaporization is a method wherein a liquid material, the flow of which is controlled, is instantaneously vaporized at a vaporizer that is preheated. This direct vaporization method requires no carrier gas such as argon to obtain a designated amount of the material gas. This differs greatly with the babbling method. Accordingly, a large amount of argon gas or helium gas is no longer necessary and this reduces the total gas flow of the reaction gas and then lengthens the time in which the material gas stays in the plasma. As a result, sufficient polymerizing reactions occur in the vapor so that a linear polymer can be formed and a film having a micropore porous structure can be obtained.

In FIG. 1, inert gas supplied through the gas inlet port 14 pushes out the liquid reacting material 18, which is the silicon-containing hydrocarbon compound, to the control valve 8 through the line 13. The control valve 8 controls the flow of the liquid reacting material 18 with the flow controller 7 so that it does not exceed a predetermined volume. The reduced silicon-containing hydrocarbon compound 18 goes to the vaporizer 17 to be vaporized by the direct vaporization method described above. Argon and helium are supplied through the inlet ports 15 and 16, respectively, and the valve 8 controls the flow volume of these gases. The mixture of the material gas and the additive gases, which is a reaction gas, is then supplied to the inlet port 5 of the plasma CVD device 1. The space between the gas diffusing plate 10 and the semiconductor substrate 4, both located inside of the reaction chamber 6 which is already evacuated, is charged with high frequency RF voltages, which are preferably 13.4 MHz and 430kHz, and the space serves as a plasma field. The susceptor 3 continuously heats the semiconductor substrate 4 with the heater 2 and maintains the substrate 4 at a predetermined temperature that is desirably 350–450° C. The reaction gas supplied through the fine openings of the gas diffusing plate 10 remains in the plasma field in proximity to the surface of the semiconductor substrate 4 for a predetermined time.

If the residence time is short, a linear polymer cannot be deposited sufficiently so that the film deposited on the substrate does not form a micropore porous structure. Since the residence time is inversely proportional to the flow volume of the reaction gas, a reduction of the flow volume of the reaction gas can lengthen its residence time.

Extremely reducing the total volume of the reaction gas is effected by reducing the flow volume of the additive gas. As a result, the residence time of the reaction gas can be lengthened so that a linear polymer is deposited sufficiently and subsequently an insulation film having a micropore porous structure can be formed.

In order to adjust the reaction in the vapor phase, it is effective to add a small amount of an inert gas, an oxidizing agent, or a reducing agent to the reaction chamber. Helium (He) and Argon (Ar) are inert gases and have different first ionization energies of 24.56 eV and 15.76 eV, respectively. Thus, by adding either He or Ar singly or both in combination in predetermined amounts, the reaction of the material gas in the vapor phase can be controlled. Molecules of the reaction gas undergo polymerization in the vapor phase, thereby forming oligomers. The oligomers are expected to have a O:Si ratio of 1:1. However, when the oligomers form a film on the substrate, the oligomers undergo further polymerization, resulting in a higher oxygen ratio. The ratio varies depending on the dielectric constant or other characteristics of a film formed on the substrate (e.g., in Example 5 described later, the ratio was 3:2).

The remaining oxygen, which is derived from the material gas and is not incorporated into the film, is dissociated from the material compound and floats in plasma. The ratio of Si:O in the material gas varies depending upon the compound. For example, in formulae 2–3 above, the ratio of O:Si is 2:1 and 1:1, respectively. If the material gas having a high ratio of O:Si (e.g., 2/1 or higher) is used, the quantity of oxygen floating in plasma increases. When the quantity of oxygen increases, the organic groups, which are directly bound to Si and necessary to form a film, are oxidized, and as a result, deterioration of the film is likely to occur. In the above, by adding a reducing agent such as $H_2$ and $CH_4$ to the reaction chamber, the oxygen partial pressure in plasma is reduced, thereby preventing the above oxidization of the organic groups. In contrast, when the O:Si ratio is low (e.g., 2/1 or lower), it is necessary to supply oxygen for forming a film by adding an oxidizing agent such as $N_2O$ and $O_2$. The appropriate amount of a reducing agent or an oxidizing agent can be evaluated in advance based on preliminary experiment in which the composition of a formed film is analyzed by FT-IR or XRS, and its dielectric constant is also analyzed. Accordingly, by selecting the appropriate type of additive gas such as He, Ar, a reducing agent, and an oxidizing agent, and by controlling the quantity of each gas to be added, a film having the desired quality can be produced.

By controlling the flow of an oxidizing agent in a range less than the flow of the material gas, an oxygen concentration in the film increases without forming an oxide film structure, and surprisingly, the dielectric constant becomes low, and further, the deposition speed significantly increases. The above effects can significantly be exhibited when (i) the flow rate of the reaction gas is prolonged, (ii) the material gas has two alkoxyl groups, and (ii) an oxidizing gas is added to an additive gas. The resulting siloxan polymer film can have a dielectric constant of 3.1 or lower and have —$SiR_2O$— repeating structural units with a C atom concentration of 20% or less (i.e., the compound is fragmented predominantly or selectively at the bond between the hydrocarbon and the oxygen).

Polymer Structure

In this method, the material gas is, in short, a silicon-containing hydrocarbon compound including at least one Si—O bond, at most two O—$C_nH_{2n+1}$ bonds and at least two hydrocarbon radicals bonded to the silicon (Si). Also, this material gas is vaporized by a direct vaporization method. The method results in an insulation film having a low dielectric constant, high thermal stability and high humidity-resistance.

More specifically, the material gas vaporized by the direct vaporization method can stay in the plasma for a sufficient length of time. As a result, a linear polymer can be formed so that a linear polymer having the basic structure (formula 4), wherein the "n" is 2 or a greater value, forms in a vapor phase. The polymer is then deposited on the semiconductor substrate and forms an insulation film having a micropore porous structure.

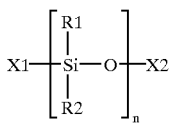

(4)

wherein X1 and X2 are $O_nC_mH_p$ wherein n is 0 or 1, m and p are integers including zero.

The insulation film of this invention has a relatively high stability because its fundamental structure has the Si—O bond having high bonding energy therebetween. Also, its dielectric constant is low because it has a micropore porous structure. Further, the fundamental structure $(—Si—O—)_n$ has, on both sides, dangling bonds ending with a hydrocarbon radical possessing hydrophobicity, and this property renders the humidity-resistance. Furthermore, the bond of a hydrocarbon radical and silicon is generally stable. For instance, both the bond with a methyl radical, i.e., Si—$CH_3$, and bond with benzene, i.e., Si—$C_6H_5$, have a dissociation temperature of 500° C. or higher. Since above semiconductor production requires thermal stability to temperatures above 450° C., that property of the film is advantageous for production of semiconductors. In an embodiment, the temperature for plasma polymerization is approximately θ±50° C. wherein θ is the thermal stability temperature required for a film.

Particularly, in an embodiment, a siloxan polymer film formed on a semiconductor substrate by the above-described method has a dielectric constant of 3.1 or lower and has —$SiR_2O$— repeating structural units and further has a C atom concentration of 20% or less formed by plasma polymerization reaction from a silicon-containing hydrocarbon having the formula $Si_\alpha O_{\alpha-1} R_{2\alpha-\beta+2}(OC_nH_{2n+1})$, wherein α is an integer of 1–3, β is 2, n is an integer of 1–3, and R is $C_{1-6}$ hydrocarbon attached to Si. In another embodiment, the siloxan polymer film has a dielectric constant of 2.7. In still another embodiment, the siloxan polymer film has R in the repeating structural unit which is $C_1$ hydrocarbon.

Further aspects, features and advantages of this invention will become apparent from the detailed description of the preferred examples which follows.

Outline of Example Structures

FIG. 1 diagrammatically shows a plasma CVD apparatus usable in this invention. This apparatus comprises a reaction gas-supplying device 12 and a plasma CVD device 1. The reaction gas-supplying device 12 comprises plural lines 13, control valves 8 disposed in the lines 13, and gas inlet ports 14, 15 and 16. A flow controller 7 is connected to the individual control valves 8 for controlling a flow of a material gas of a predetermined volume. A container accommodating liquid reacting material 18 is connected to a vaporizer 17 that directly vaporizes liquid. The plasma CVD device 1 includes a reaction chamber 6, a gas inlet port 5, a susceptor 3 and a heater 2. A circular gas diffusing plate 10 is disposed immediately under the gas inlet port. The gas diffusing plate 10 has a number of fine openings at its bottom face and can inject reaction gas to the semiconductor substrate 4 therefrom. There is an exhaust port 11 at the bottom of the reaction chamber 6. This exhaust port 11 is connected to an outer vacuum pump (not shown) so that the inside of the reaction chamber 6 can be evacuated. The susceptor 3 is placed in parallel with and facing the gas diffusing plate 10. The susceptor 3 holds a semiconductor substrate 4 thereon and heats it with the heater 2. The gas inlet port 5 is insulated from the reaction chamber 6 and connected to an outer high frequency power supply 9. Alternatively, the susceptor 3 can be connected to the power supply 9. Thus, the gas diffusing plate 10 and the susceptor 3 act as a high frequency electrode and generate a plasma reacting field in proximity to the surface of the semiconductor substrate 4.

A method for forming an insulation film on a semiconductor substrate by using the plasma CVD apparatus of this invention comprises a step of directly vaporizing silicon-containing hydrocarbon compounds expressed by the general formula $Si_\alpha O_\beta C_x H_y$ (α, β, x, and y are integers) and then introducing it to the reaction chamber 6 of the plasma CVD device 1, a step of introducing an additive gas, whose flow is substantially reduced, into the reaction chamber 6 and also a step of forming an insulation film on a semiconductor substrate by plasma polymerization reaction wherein mixed gases, made from the silicon-containing hydrocarbon compound as a material gas and the additive gas, are used as a reaction gas. It is a remarkable feature that the reduction of the additive gas flow also renders a substantial reduction of the total flow of the reaction gas. This feature will be described in more detail later.

Other Techniques

There is an example that an oxidation film is formed using an ordinary plasma CVD method by adding an oxidation gas such as O2 and N2O to organic silicon SiRx(OR)y: (R:CnHm x,y: random nature). A film formed at this time, however, is an oxidation film with a dielectric constant of approximately 4 and cannot be used as a next-generation low dielectric constant film.

Additionally, an example to form a low dielectric constant film with a dielectric constant of 2.7 using an oxidation gas such as N2O, etc. on SiH(CH3)3 has been reported. A film formed in this case is a SiCOH film with a high C concentration containing C of 20% or more.

EXAMPLES

Equipment Configuration

Figure 2:
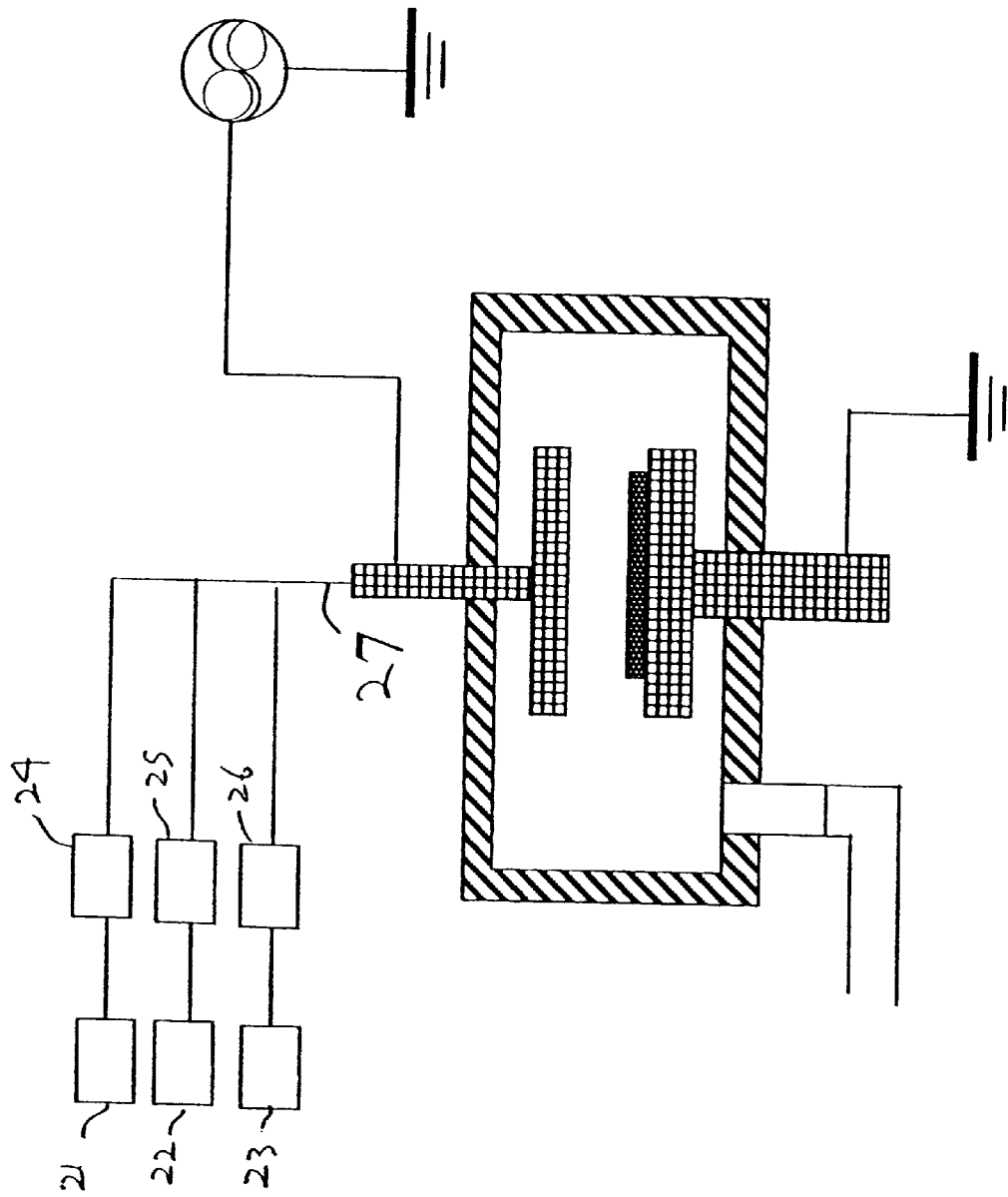
FIG. 2 is a schematic diagram illustrating a plasma CVD apparatus used in the example.

FIG. 2 is a drawing of parallel-flat-plate type CVD equipment. Two pairs of electrically conductive flat-plate electrodes are placed in a reaction chamber opposite and parallel to each other, and plasma is excited between these two pairs of electrodes by applying 27 MHz RF power to one side and grounding the other side. A temperature regulating mechanism is attached to a lower stage and the temperature is maintained at approximately 400° C. (752° F.). DM-DMOS (Dimethydimetoxysilane):Si(CH3)2 (OCH3)2 and inert gases such as He and Ar, and additionally oxidizing gases such as O2, N2O, etc. are mixed and used as a reaction gas. Each gas is regulated at a given flow through feeding devices 21 to 23 and flow regulators 24 to 26, and these are mixed and brought in an inlet 27 at the top of an upper electrode as a reaction gas. 500~10,000 pores (3,000 pores formed in this mode for carrying out this invention) of approximately φ0.5 mm are formed at the upper electrode and the reaction gas brought in flows to a reaction space through these pores. The reaction space is exhausted by a vacuum pump and is maintained at a predetermined fixed pressure of approximately 600 Pa.

Film-Forming Reaction

With DM-DMOS as a material gas, the Long Residence Plasma CVD, film was formed under the conditions described below. Oxygen was added at a flow rate equal to or less than that of the material gas, DM-DMOS, to the reaction gas.

RF power supply: 1500W (use the frequency made from 2 Hz) (preferably 500–2000W)
Substrate temperature: 400° C. (preferably 300–600° C.)
Reacting pressure: 650 Pa (preferably 400–1000 Pa)

The residence time (Rt) is defined with the following formula.

$$Rt[s]=9.42\times10^7(Pr\cdot Ts/Ps\cdot Tr)r_w^2 d/F$$

In this formula, each abbreviation indicates the following parameter.
Pr: reaction chamber pressure (Pa)
Ps: standard atmospheric pressure (Pa)
Tr: average temperature of the reaction gas (K)
Ts: standard temperature (K)
$r_w$: radius of the silicon substrate (m)
d: space between the silicon substrate and the upper electrode (m)
F: total flow volume of the reaction gas (sccm)
Individual parameters were fixed at the following values; only the flow volume was varied so as to find out the relationship between the flow volume and the dielectric constant.
Pr=$6.50\times10^2$ (Pa)
Ps=$1.01\times10^5$ (Pa)
Tr=273+400=673 (K)
Ts=273 (K)
$r_w$=0.1 (m)
d=0.014 (m)
Table 1 lists comparative examples and present invention's examples.

TABLE 1

|  | Material Gas Flow (sccm) | He (sccm) | O2 (sccm) | Reaction Gas Total Flow (sccm) | Rt (msec) |
| --- | --- | --- | --- | --- | --- |
| Ex.1 | 100 | 30 | 70 | 200 | 172 |
| C.Ex. | 100 | 30 | 0 | 130 | 265 |

Experiment Results

Example 1

140 sccm of DM-DMOS as a material gas and 70 sccm of O2 and He:30 sccm as added gases were mixed and brought in a reaction chamber as a reaction gas. The pressure within the reaction chamber was exhausted at all times by a vacuum pump and was maintained at 650 Pa. 1500W 27 MHz RF power was applied to an upper electrode. The temperature of a lower stage was regulated at a fixed temperature of 400° C. (752° F.). Under these conditions, a film was formed at a speed of 500 nm/min, and a dielectric constant measured by applying a voltage of 1 MHz to a film formed was 2.70. A film structure measured by XPS was Si:C:O=33:22:45 (%).

The above-mentioned experiment results are summarized in the following table:

TABLE 2

|  | Example 1 | Comparative Example |
| --- | --- | --- |
| Depo rate (nm/min) | 1500 | 500 |
| k | 2.45 | 2.70 |
| Si:C:O (at %) | 31:16:53 | 33:22:45 |

Effects of Industrial Use

The present invention enables film-forming of a low dielectric constant film using a plasma CVD method. Using this low dielectric constant film as an insulation film for highly integrated semiconductor elements, delays caused by capacity between wiring can be lessened and the working speed of semiconductor elements can be substantially increased. For example, as shown in the table below, as the size of a device node is reduced, a lower dielectric constant (low-k) is required for an interlayer insulation film used for the device.

| Device node | k |
| --- | --- |
| 0.13 μm | Approx. 3.5 or less |
| 0.10 μm | Approx. 2.7 or less |
| 0.07 μm | Approx. 2.2 or less |

For low-k films with a dielectric constant of approximately 2.7, a large number of film-forming methods such as CVD methods and coating methods have been proposed and forming quality low-k films has become possible in recent years. Application of the methods to mass-produce devices with a device node of 0.10~0.13 μm is beginning. For next-generation high-speed devices, still lower low-k films with a dielectric constant of approximately k=2.5 or less are now required. The present invention can provide the quality film required in the industry.

It will be understood by those of skill in the art that numerous and various modifications can be made without departing from the spirit of the present invention. Therefore, it should be clearly understood that the forms of the present invention are illustrative only and are not intended to limit the scope of the present invention.

What is clamed is:

1. A siloxan polymer insulation film formed on a semiconductor substrate, obtainable by a method comprising the steps of:
    vaporizing a silicon-containing hydrocarbon compound to produce a material gas for siloxan polymer, said silicon-containing hydrocarbon having the formula $Si_\alpha O_{\alpha-1} R_{2\alpha-\beta+2}(OC_n H_{2n+1})_\beta$ wherein $\alpha$ is an integer of 1–3, $\beta$ is 2, n in an integer of 1–3, and R is $C_{1-6}$ hydrocarbon attached to Si;
    introducing the material gas into a reaction chamber for plasma CVD processing wherein a semiconductor substrate is placed;
    introducing an additive gas comprising an inert gas and an oxidizing gas, said oxidizing gas being used in an amount less than the material gas; and
    forming a siloxan polymer film having —$SiR_2O$— repeating structural units on the semiconductor substrate by activating plasma polymerization reaction in the reaction chamber,
    which siloxan polymer has a dielectric constant of 3.1 or lower and which has —$SiR_2O$— repeating structural units and has a C atom concentration of 20% or less formed by plasma polymerization reaction from a silicon-containing hydrocarbon having the formula $Si_\alpha O_{\alpha-1} R_{2\alpha-\beta+2}(OC_n H_{2n+1})_\beta$ wherein $\alpha$ is an integer of 1–3, $\beta$ is 2, n is an integer of 1–3, and R is $C_{1-6}$ hydrocarbon attached to Si.

2. The siloxan polymer insulation film according to claim 1, which has a dielectric constant of 2.7 or less.

3. The siloxan polymer insulation film according to claim 1, wherein said R in the repeating structural unit is $C_1$ hydrocarbon.

* * * * *

UNITED STATES PATENT AND TRADEMARK OFFICE
CERTIFICATE OF CORRECTION

PATENT NO. : 6,559,520 B2
DATED : May 6, 2003
INVENTOR(S) : Nobuo Matsuki et al.

It is certified that error appears in the above-identified patent and that said Letters Patent is hereby corrected as shown below:

Title page,
Item [60], please delete "Division of application No. 09/827,616, filed on Apr. 6, 2001, which is a continuation-in-part of application No. 09/243,156, filed on Feb. 2, 1999, now abandoned." and add -- Division of application No. 09/827,616, filed on Apr. 6, 2001, which is a continuation-in-part of application No. 09/243,156, filed on Feb. 2, 1999, now abandoned, and which is a continuation-in-part of application No. 09/326,847, filed on Jun. 7, 1999, and which is a continuation-in-part of application No. 09/326,848, filed on Jun 7, 1999, and which is a continuation-in-part of application No. 09/691,376, filed on Oct. 18, 2000. --

Signed and Sealed this

Thirtieth Day of November, 2004

JON W. DUDAS
*Director of the United States Patent and Trademark Office*